United States Patent [19]

Araghi

[11] Patent Number: 4,604,161
[45] Date of Patent: Aug. 5, 1986

[54] METHOD OF FABRICATING IMAGE SENSOR ARRAYS

[75] Inventor: Mehdi N. Araghi, Webster, N.Y.

[73] Assignee: Xerox Corporation, Stamford, Conn.

[21] Appl. No.: 729,705

[22] Filed: May 2, 1985

[51] Int. Cl.$^4$ .................... H01L 21/306; B44C 1/22; C03C 15/00; C03C 25/06

[52] U.S. Cl. .................... 156/645; 29/572; 29/580; 29/583; 156/633; 156/647; 156/651; 156/657; 156/659.1; 156/662

[58] Field of Search ............. 156/645, 647, 651, 657, 156/659.1, 661.1, 662, 633; 29/580, 583, 572; 357/24, 29, 45, 55

[56] References Cited

U.S. PATENT DOCUMENTS

| | | | |
|---|---|---|---|
| 3,247,576 | 4/1966 | Dill, Jr. et al. | 29/155.5 |
| 3,936,329 | 2/1976 | Kendall et al. | 148/187 |
| 4,019,248 | 4/1977 | Black | 29/583 |
| 4,269,653 | 5/1981 | Wada et al. | 156/644 |
| 4,325,182 | 4/1982 | Tefft et al. | 29/583 |

FOREIGN PATENT DOCUMENTS 130608 2/1977 German Democratic Rep. .

OTHER PUBLICATIONS

Herrman, "Silicon Chip Separation to Permit Chip Butting", RCA Technical Notes, TN No. 1110, May 1975.

Tsang et al., "Preferentially Etched Diffraction Gratings in Silicon", Journal of Applied Physics, May 1975, No. 5, pp. 2163–2166.

Bassous, "Fabrication of Novel Three-Dimensional Microstructures by the Anisotropic Etching of (100) and (110) Silicon", IEEE Transactions, vol. ED-25, No. 10, Oct. 1978, pp. 1178–1185.

*Primary Examiner*—William A. Powell
*Attorney, Agent, or Firm*—Frederick E. McMullen

[57] ABSTRACT

A sensor array for butting against other like arrays to form a full width array. The active surface of the array chip is first etched to form a V-shaped groove defining an array end; then a parallel groove is cut in the opposite inactive surface with a centerline parallel to but offset from the centerline of the V-shaped groove by an amount sufficient to allow extension of the wafer (111) crystalline plane from the V-shaped groove to the cut groove; then the water is supported in cantilever fashion along an edge substantially coplanar with the V-shaped groove and a downward force is applied to the wafer free end to cause the wafer to fracture along the (111) crystalline plane thereby cleaving the chip from the wafer and providing a uniformly smooth and straight array end for butting against the end of a like array.

5 Claims, 6 Drawing Figures

METHOD OF FABRICATING IMAGE SENSOR ARRAYS

The invention relates to image sensor arrays and method of fabricating such arrays, and more particularly, to an image sensor array for assembly with other like arrays to form a longer composite array without sacrifice of image quality.

Image sensor arrays for scanning document images, such as Charge Coupled Devices (CCD's), typically have a row or linear array of photosites together with suitable supporting circuitry integrated onto a substrate or chip. Usually, an array of this type is used to scan line by line across the width of a document with the document being moved or stepped lengthwise in synchronism therewith.

In the above application, the image resolution is proportional to the ratio of the scan width and the number of array photosites. Because of the difficulty in economically designing and fabricating long arrays, image resolution for the typical array commercially available today is relatively low when the array is used to scan a full line. While resolution may be improved electronically as by interpolating extra image signals or pixels, or by interlacing several smaller arrays with one another so as to crossover from one array to the next as scanning along the line progresses, electronic manipulations of this type adds to both the complexity and the cost of the system. Further, single or multiple array combinations such as described above usually require more complex and expensive optical systems.

However, a long or full width array having a length equal to the document line and with a large packing of photosites to assure high resolution has been and remains a very desirable but so far unattainable aim. In the pursuit of a long or full width array, forming the array by butting several small arrays together has often been postulated. However, the need, which is critical, to provide arrays whose photosites extend to the border or edge of the substrate, so as to assure continuity when the array is butted to other arrays, and at the same time provide edges that are sufficiently smooth and straight to be butted together without loss of image data has proved to be a formable obstacle. For although the standard technique of scribing and cleaving silicon wafers used by the semiconductor industry for many years produces chips having reasonably controlled dimensions, the microscopic damage occurring to the chip surface during the scribing operation has effectively precluded the disposition of the photosites at the chip edge. Instead, it has necessitated that a safe distance be maintained between the last or end photosites and the chip edges if operation of the end photosites is not to be impaired by the presence of microcracks and dislocations occurring along the cleaved edges. In addition, if the size or aspect ratio (i.e. length/width) of the chip is beyond certain limits, the scribe-then-cleave process introduces a risk of breaking the chips, leading to very low chip yields. As a result, standard chip forming techniques completely fail in the special case where it is desired to fabricate chips to be butted together with one another to form a longer array having a full complement of active sensors, i.e. linear or two dimensional optical sensors.

The present invention seeks to address and rectify the above by providing a method of fabricating a high resolution sensor array or chip capable of being abutted against other like arrays to form a longer array without image loss or distortion at the array junctions, comprising the steps of: etching a small V-shaped groove in one side of a (100) silicon wafer defining the chip end, the walls of the V-shaped groove paralleling the (111) crystalline plane of the wafer; forming a relatively wide groove in the opposite side of the wafer, the axis of the groove being parallel to and offset from the axis of the V-shaped groove by an amount such that the (111) crystalline plane in which one wall of the V-shaped groove lies intercepts the wide groove at substantially the midpoint of the wide groove; applying a downward bending force to the wafer proximate the V-shaped groove along the (111) plane so that the wafer fractures and pivots about the bottom of the wide groove with the fracture extending from the bottom of the V-shaped groove to the wide groove whereby to provide a uniformly flat precisely controlled end for the chip; and forming the opposite end of the chip in the same manner to provide an array having uniformly flat precisely controlled ends for butting with like ends of other arrays to form a longer array.

IN THE DRAWINGS

Figure 1:
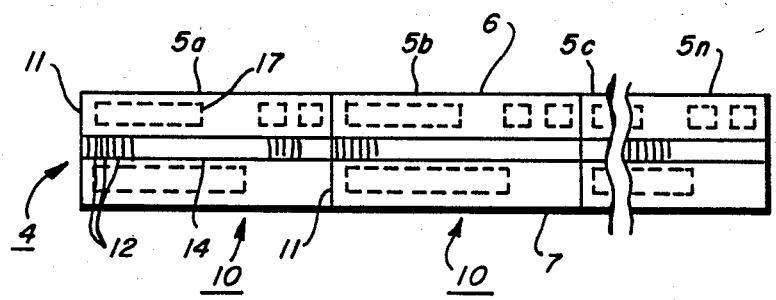
FIG. 1 is a top view illustrating a long array composed of several smaller arrays fabricated in accordance with the teachings of this invention butted together.
Figure 2:
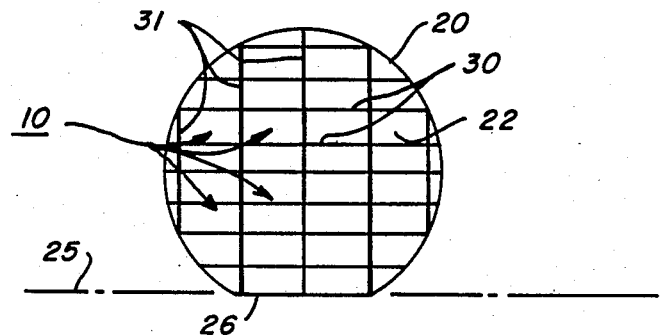
FIG. 2 is a top view of a silicon wafer prior to cleavage of individual array chips therefrom.
Figure 3:
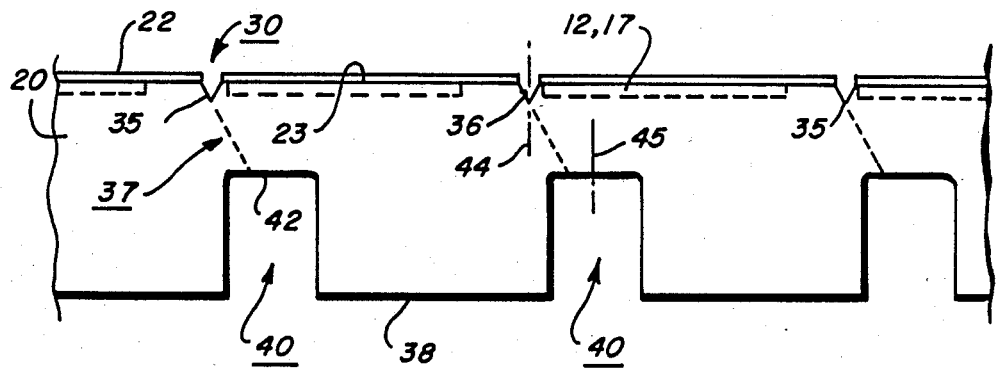
FIG. 3 is an enlarged side view in cross section of the wafer shown in FIG. 2 showing details of the chip cleaving technique of the present invention.

Referring particularly to FIG. 1 of the drawings, there is shown a long or full width scanning array 4 composed of a plurality of smaller sensor arrays 5a, 5b, . . . 5n butted together end to end. Sensor arrays 5a, 5b, . . . 5n, which may for example comprise Charge Coupled Device or CCD type arrays, are fabricated in accordance with the teachings of the invention as will appear more fully hereinbelow. As will be understood by those skilled in the art, array 4 is typically used to read or scan a document original line by line and convert the document image to electrical signals or pixels. Preferably, array 4 is a full length array having an overall length L equal to slightly greater than the width of the largest document to be scanned. As will appear, sensor arrays 5a, 5b, . . . 5n are fabricated so that the row 14 of photosites 12 of each array extend to the edges of the array so that when arrays 5a, 5b, . . . 5n are butted together, there is formed a continuous and uninterrupted row of photosites on array 4.

Each of the arrays 5a, 5b, . . . 5n is formed on a silicon substrate or chip 10 with a plurality of photosites 12 integrated thereon in a linear row or array 14. Typically, chip 10 is relatively thin and has a generally rectangular shape, with the axis of the row 14 of photosites paralleling the longitudinal axis of chip 10. While a single row or array 14 of photosites 12 is shown, plural photosite rows or arrays may be contemplated. Other circuits such as shift registers, gates, pixel clock, etc.

(designated generally by the numeral 17 herein), are preferably formed integral with chip 10. Suitable external connectors (not shown) are provided for electrically coupling the sensor arrays 5a, 5b, . . . 5n to related external circuitry.

When a single array 5 is used for scanning purposes, the image resolution achieved is a function of the number of photosites 12 that can be fabricated on the array chip 10 divided by the width of the scan line. Since the number of photosites 12 that can be packed onto a single chip is limited, it would be advantageous if several smaller arrays could be butted together end to end to form a longer array, and preferably to form a full width or full size array whose scan area is coextensive with the scan line.

Chip 10 is fabricated from a larger wafer 20 of (100) silicon of the type commonly employed to make integrated circuits. Referring to FIGS. 2–5, during fabrication of chip 10, a suitable Integrated Circuit mask 22 is placed on the top surface 23 of the wafer 20 at the points where chip 10 is to be separated from wafer 20, mask 22 being carefully aligned with the (110) crystalline axis 25 of the wafer 20. To help locate and align mask 22, a flat 26 along one side of wafer 20 may be used, flat 26 being parallel with the (110) crystalline axis of wafer 20. As will be understood by those skilled in the art, flat 26 is normally present on industrial silicon wafers and mask 22 is located so that the chip separating lines thereof are within a fraction of a degree of the wafer (110) crystalline axis 25. Mask 22 has line-like openings or scribe lines 30 which delineate with particular accuracy the top and bottom edges 6, 7 of chip 10 and openings or scribe lines 31 which delineate the opposite ends 11 of chip 10. Openings 30, 31 in mask 22 have a predetermined width.

With mask 22 in place, wafer 20 is etched using a suitable anisotropic etchant such as an Ethylenediamine/Pyrocatechol/H2O solution to form, at the point of openings 30, 31, V-shaped grooves 34, corresponding to the top and bottom edges, 6, 7 and the ends 11 of chip 10 respectively. Grooves 34, 35 have walls 36 defined by the (111) crystalline planes 37. Inside grooves 40 are thereafter formed parallel to and in registration with the etched end grooves 35 in the bottom surface 38 of wafer 20. Grooves 40, which may be formed by sawing, have a depth such that the base 42 of the grooves 40 is spaced sufficiently far from any other circuits 17 integrated on or which may later be integrated on chip 10 to prevent interference therewith. The centerline 45 of inside grooves 40 is deliberately offset from the centerline 44 of the etched end groove 35associated therewith by an amount sufficient to allow the etension of the (111) crystalline plane 37 of the related ethed end groove 35 to terminate near or adjacent the centerline or middle portion 45 of the inside groove 40.

Figure 4:
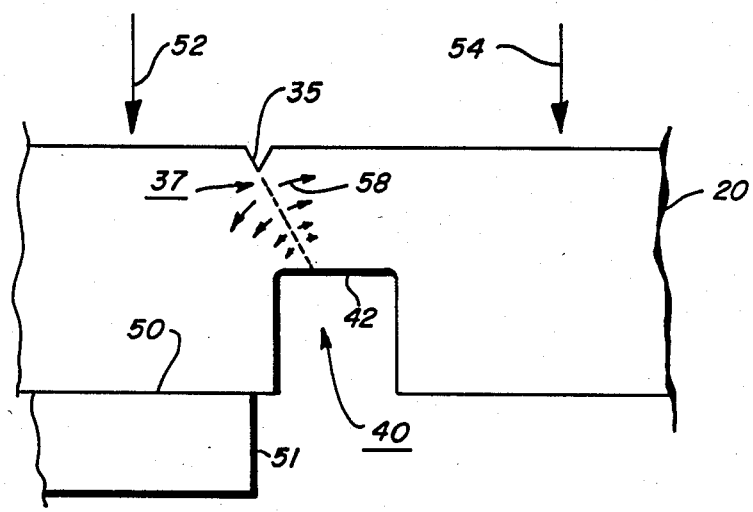
FIG. 4 is an enlarged side view in cross section illustrating the forces acting on the wafer when cleaving.

Referring particularly to FIG. 4, following forming of the grooves 34, 35, 40 in wafer 20, wafer 20 is held tightly against a flat surface 50 by means of a suitable retaining force 52. Wafer 20 is positioned on surface 50 so that the outer edge 51 of surface 50 parallels and is spaced slightly from the end groove 35 and the inside groove 40 associated therewith at the point where cleavage is to be made. To cleave or separate the chip 10 from wafer 20, a downward bending force 54 is exerted on the outwardly projecting end of wafer 20 causing cleavage fractures (designated by the numeral 58) to initiate at the bottom of the etched end groove 35 and naturally propagate along the crystalline plane 37 of the wafer from the bottom of the etched end groove 35 to inside groove 40. Following separation between chip 10 and wafer 20 at one end, the opposite end of the chip 10 is similarly cleaved.

As a result, each end 11 of chip 10 is formed with a uniformly flat and smooth surface, the surfaces precisely defining the chip end boundaries and enabling the chip 10 to be abutted and joined with other chips end to end to form a long array 4 composed of a plurality of smaller arrays 5a, 5b, . . . 5n. And since the areas of chip 10 bordering the ends 11 are inherently devoid of stress, the chips produced have ends 11 which are substantially more resistant to chipping.

The top and bottom edges 6, 7 respectively of chip 10, which are delineated by grooves 34, may be formed in the same manner. However, since edges 6, 7 do not normally require the same degree of accuracy and smoothness, chip 10 may be separated from wafer 20 at the top and bottom edges in other more conventional ways. For example, chip 10 may be separated by sawing along the top and bottom edges using etched grooves 34 a guide.

Following separation of chip 10 from wafer 20, photosites 12 and any other circuits 17 may be formed on chip 5 in the conventional manner, it being understood that the photosite array 14 is located on chip 10 so that the photosites extend across the face of the chip from end to end. Alternately, the array of photosites 14 together with any other circuits 17 may be formed on wafer 20 prior to separating chips 10 therefrom. In that event, mask 22 is arranged so that the scribe lines 31 pass through the junction between adjoining photosites 12 at the point where it is desired to cleave chip 10 to assure that the last or end photosites are substantially the same size as the other photosites that comprise the row 14 of photosites 12.

Figure 5:
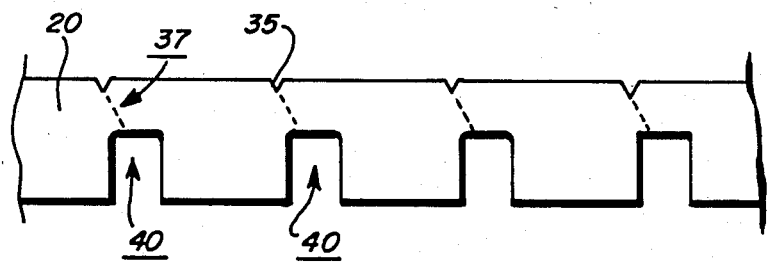
FIG. 5 is a view in cross section of the wafer shown in FIG. 2 showing the chip cleaving technique for forming parallelogram shaped chips.
Figure 6:
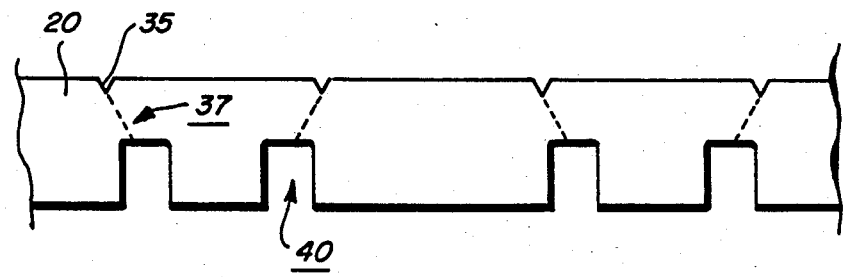
FIG. 6 is a view in cross section of the wafer shown in FIG. 2 showing the chip cleaving technique for forming trapezoidal shaped chips.

The planes 37 along which cleavage takes place at the ends 11 of chip 10 can be made parallel to each other as shown at 60 in FIG. 5 or intersecting as shown at 62 in FIG. 6. This in turn provides either the parallelogram chip shape shown in FIG. 5 or the trapezoidal chip shape shown in FIG. 6. These chips shapes are accomplished by properly locating inside groove 40 in wafer 20 relative to the V-shaped end groove 35 associated therewith since during the cleavage, the area at the bottom 42 of the groove 40 acts as the pivot for the bending moment produced in the wafer. Fracture starts at the point of maximum stress caused by the applied force 54, namely, the bottom of the etched groove 35 with the applied stress being zero at the bottom 42 of groove 40. Thus, the favored cleavage plane is the one which intersects the groove 40 in the vicinity of the pivot point.

If the grooves 40 are outside the chip boundaries as defined by the etched grooves 35, the cleavage planes 37 will run outwardly as shown in FIG. 5 resulting in a parallelogram shaped chip. Where the grooves 40 at the opposite ends of the chip 10 are located mostly within the chip boundaries, the cleavage planes 37 will run inwardly as shown in FIG. 6 resulting in a trapezoidal shaped chip. Where one groove 40 is within the boundaries of the chip, the cleavage planes 37 will run inward at that side and will be parallel to the cleavage plane at the other end which runs outwardly with respect to the chip outline. As will be understood, a large number of chip geometries are possible.

The length of the etch line for groove 35 is not required to be coextensive with the chip boundary, but may instead be less and may be as low as one third the length of the chip boundary. Further, grooves 40 may, following forming, be etched in EDP or another suitable anisotropic etchant to remove any stresses resulting from formation thereof.

While CCD type sensor arrays are shown and described herein, other sensor array types may be contemplated. Further, while image scanning or reading arrays are described, image writing arrays having for example one or more linear rows of selectively actuable LED's may be contemplated.

While the invention has been described with reference to the structure disclosed, it is not confined to the details set forth, but is intended to cover such modifications or changes as may come within the scope of the following claims.

I claim:

1. A method of fabricating a high resolution sensor array or chip capable of being abutted against other like arrays to form a longer array without image loss or distortion at the array junctions, comprising the steps of:
    (a) etching a small V-shaped groove in one side of a (100) silicon wafer defining the chip end, the walls of the V-shaped groove paralleling the (111) crystalline plane of the wafer;
    (b) forming a relatively wide groove in the opposite side of the wafer, the axis of the said wide groove being parallel to and offset from the axis of the V-shaped groove by an amount such that the (111) crystalline plane in which one wall of the V-shaped groove lies intercepts said wide groove at substantially the midpoint of said groove;
    (c) applying a downward bending force to the wafer proximate the V-shaped groove along the (111) plane so that the wafer fractures and pivots about the bottom of said wide groove with the fracture extending from the bottom of the V-shaped groove to said wide groove whereby to provide a uniformly flat precisely controlled end for the chip; and
    (d) forming the opposite end of the chip in the same manner to provide an array having uniformly flat precisely controlled ends for butting with like ends of other arrays to form a longer array.

2. A method for producing scanning arrays having precisely controlled ends enabling one of the arrays to be butted against another of the arrays to form a longer composite array without distortion or damage to the image scanning properties of the arrays, the arrays being formed on individual chips cleaved from a larger (100) silicon wafer, comprising the steps of:
    (a) etching a small V-shaped groove in one side of said wafer defining said chip ends, the walls of the V-shaped groove paralleling the (111) crystalline plane of said wafer;
    (b) cutting a relatively wide groove in the opposite side of said wafer in association with each of said V-shaped grooves, the axis of each of said cut grooves being parallel to and offset from the axis of said V-shaped groove associated therewith by an amount such that the (111) crystalline plane in which one wall of said V-shaped groove lies intercepts said cut groove substantially at the midpoint of said cut groove; and
    (c) applying a downward bending force to cause said wafer to pivot about the bottom of said cut groove and fracture said wafer along said (111) plane with said fracture extending from the bottom of said V-shaped groove to said cut groove whereby to provide a uniformly flat precisely controlled end for said array.

3. The method according to claim 2 in which the direction of offset of said cut grooves relative to the associated V-shaped grooves is selected to provide a desired chip shape.

4. The method according to claim 2 in which the direction of offset of said cut grooves in said chip are selected so that the (111) crystalline planes defining the opposite ends of each array are parallel whereby to provide arrays that are parallelogram shaped in cross section.

5. The method according to claim 2 in which the direction of offset of said cut grooves in said chip are selected so that the (111) crystalline planes defining the opposite ends of each array intersect with one another whereby to provide arrays that are trapezoidal shaped in cross section.

* * * * *